(12) United States Patent
Poli

(10) Patent No.: US 9,149,983 B2
(45) Date of Patent: Oct. 6, 2015

(54) CRYSTAL USED FOR CLOSING THE TOP OF THE CASE OF A PORTABLE OBJECT AND METHOD OF WELDING A CRYSTAL OF THIS TYPE

(75) Inventor: Gian-Carlo Poli, Les Geneveys-sur-Coffrane (CH)

(73) Assignee: The Swatch Group Research and Development Ltd., Marin (CH)

( * ) Notice: Subject to any disclaimer, the term of this patent is extended or adjusted under 35 U.S.C. 154(b) by 340 days.

(21) Appl. No.: 13/818,222

(22) PCT Filed: Sep. 26, 2011

(86) PCT No.: PCT/EP2011/066664
§ 371 (c)(1),
(2), (4) Date: Feb. 21, 2013

(87) PCT Pub. No.: WO2012/055656
PCT Pub. Date: May 3, 2012

(65) Prior Publication Data
US 2013/0153289 A1    Jun. 20, 2013

(30) Foreign Application Priority Data

Oct. 27, 2010  (EP) .................................... 10189101

(51) Int. Cl.
*G04B 39/02* (2006.01)
*B29C 65/56* (2006.01)
*G04B 39/00* (2006.01)
(Continued)

(52) U.S. Cl.
CPC .............. *B29C 65/56* (2013.01); *G04B 39/004* (2013.01); *G04B 39/025* (2013.01); *G04G 21/08* (2013.01); *H02G 3/14* (2013.01); *H05K 1/0306* (2013.01)

(58) Field of Classification Search
CPC ....... G04G 17/045; G04G 17/06; B29C 65/08
USPC .......................................................... 368/294
See application file for complete search history.

(56) References Cited

U.S. PATENT DOCUMENTS 4,196,577 A * 4/1980 Ohno et al. ..................... 368/82
4,403,315 A * 9/1983 Saito et al. ..................... 368/321
(Continued)

FOREIGN PATENT DOCUMENTS

CH           251697      11/1947
EP         0 334 182      9/1989
(Continued)

OTHER PUBLICATIONS

International Search Report Issued Apr. 20, 2012 in PCT/EP11/66664 Filed Sep. 26, 2011.

*Primary Examiner* — Anthony Q Edwards
(74) *Attorney, Agent, or Firm* — Oblon, McClelland, Maier & Neustadt, L.L.P.

(57) ABSTRACT

A crystal and an ultrasonic welding method for a crystal. The crystal is used to close a top of a case of a portable object, the crystal being made of a transparent plastic material and being secured to the case of the portable object by ultrasonic welding. The crystal includes a top surface and a bottom surface that carry one or more conductive paths made of a transparent conductive material, and a peripheral rim that extends along at least one portion of the perimeter of the crystal. The peripheral rim provides at least one surface for the ultrasonic welding of the crystal to the case of the portable object.

16 Claims, 2 Drawing Sheets

(51) Int. Cl.
*G04G 21/08* (2010.01)
*H02G 3/14* (2006.01)
*H05K 1/03* (2006.01)

(56) References Cited

U.S. PATENT DOCUMENTS

| | | | | |
|---|---|---|---|---|
| 4,558,957 | A * | 12/1985 | Mock et al. | 368/294 |
| 4,648,722 | A | 3/1987 | Mock et al. | |
| 4,993,007 | A * | 2/1991 | Meister | 368/294 |
| 5,036,502 | A | 7/1991 | Grosjean | |
| 5,077,711 | A | 12/1991 | Grosjean | |
| 6,053,631 | A * | 4/2000 | Mock et al. | 368/281 |
| 6,259,656 | B1 * | 7/2001 | Kotanagi | 368/204 |
| 6,914,564 | B2 * | 7/2005 | Barras et al. | 343/700 MS |
| 8,275,327 | B2 * | 9/2012 | Yi et al. | 455/90.3 |
| 8,301,211 | B2 * | 10/2012 | Lee et al. | 455/575.6 |
| 8,328,415 | B2 * | 12/2012 | Kachi et al. | 368/281 |
| 2002/0118605 | A1 | 8/2002 | Born et al. | |
| 2005/0047282 | A1 * | 3/2005 | Sakurazawa et al. | 368/281 |
| 2009/0143117 | A1 * | 6/2009 | Shin et al. | 455/575.6 |
| 2010/0112949 | A1 * | 5/2010 | Kim et al. | 455/41.3 |
| 2011/0007468 | A1 * | 1/2011 | Burton et al. | 361/679.03 |
| 2011/0053666 | A1 * | 3/2011 | Kang et al. | 455/575.6 |

FOREIGN PATENT DOCUMENTS

| | | |
|---|---|---|
| EP | 1 122 620 | 8/2001 |
| EP | 1 128 239 | 8/2001 |
| GB | 1 281 505 | 7/1972 |

\* cited by examiner

CRYSTAL USED FOR CLOSING THE TOP OF THE CASE OF A PORTABLE OBJECT AND METHOD OF WELDING A CRYSTAL OF THIS TYPE

CROSS-REFERENCE TO RELATED APPLICATIONS

This is a National Phase Application in the United States of International Patent Application PCT/EP 2011/066664 filed Sep. 26, 2011, which claims priority on European Patent Application No. 10189101.8 of Oct. 27, 2010. The entire disclosures of the above patent applications are hereby incorporated by reference.

The present invention concerns a crystal used to close the top of the case of a portable object. More specifically, the present invention concerns a crystal made of a transparent plastic material intended to be ultrasonic welded onto the case of the portable object.

For the purposes of the present invention, a "portable object" is an object of small dimensions able, for example, to be worn on a user's wrist such as a wristwatch. It may also be a mobile telephone or a portable computer. In short, objects of this type include a case which houses the electronic or electromechanical components, the base of which is closed by a back cover and the top by a crystal or a screen.

Let us consider the particular case of a wristwatch with capacitive touch keys. These touch keys are created by depositing electrodes made of transparent conductive material on the bottom surface of the watch crystal (i.e. the surface facing the dial side of the watch). By placing a finger close to the surface of the watch crystal, the user generates a variation in capacitance between his finger and the electrode opposite. This variation in capacitance is detected by a control circuit of the watch and is interpreted by the control circuit as the entry of an instruction. The operation associated with the instruction entered is then performed by the control circuit of the watch.

The electrodes for sensing the variation in capacitance are made of a transparent conductive material such as tin indium oxide (ITO). These electrodes are structured on the bottom surface of the crystal and extend as far as the peripheral edge of the crystal to allow the connection thereof to the electronic control circuit located in the watch case. The crystal is made of a transparent plastic material and is ultrasonic welded to the watch case, which is also made of plastic. More specifically, an element known as a waveguide is arranged on the peripheral edge of the crystal. This waveguide concentrates the ultrasonic waves and causes localised heating which results in a weld by melting the crystal and the watch case.

Since the electrodes extend in proximity to the peripheral edge of the crystal they are thus subject, during ultrasonic welding, to severe mechanical and thermal stresses. As the electrodes are rigid, they have difficulty withstanding these stresses which can damage them or even detach them from their substrate.

Further, even if it were attempted to ultrasonic weld this type of crystal, the presence of transparent conductive paths would make this operation awkward to perform, since the material of which the transparent conductive paths are made is much harder than the plastic material of which the crystal is made. Consequently, the solution usually used for securing a plastic crystal to the middle part of a watch is bonding by means of an adhesive. The drawbacks of this solution are known: over time the adhesive ages, which causes sealing problems and even problems of mechanical resistance.

It is therefore an object of the present invention to overcome this drawback in addition to others by providing a crystal made of a transparent plastic material provided with ultrasonic welding surfaces distant from the bottom surface of the crystal.

The present invention therefore concerns a crystal used to close the top of the case of a portable object, said crystal being made of a transparent plastic material and being secured to the case of the portable object by ultrasonic welding, said crystal having a top surface and a bottom surface which carries one or more conductive paths made of a transparent conductive material, said crystal being characterized in that it has a peripheral rim which extends along at least one portion of the perimeter of the crystal, said peripheral rim providing at least one surface for the ultrasonic welding of the crystal to the case of the portable object.

As a result of these features, the present invention provides a crystal for closing a case of a portable object which has a peripheral rim for shifting the location of the ultrasonic weld to an area remote from the plane into which the bottom surface of the crystal extends. This avoids damaging the conductive paths made of transparent conductive material such as ITO carried on the bottom surface of the crystal. Indeed, these conductive paths are not ductile and therefore have a tendency to peel off by the effect of delamination when the temperature is increased due to ultrasonic welding.

Owing to the presence of the peripheral rim, the ultrasonic welding occurs on surfaces free of the transparent conductive layers and sufficiently far away from said transparent conductive layers that the mechanical stresses generated by ultrasonic welding have no effect on the adhesion of these layers to the bottom surface of the crystal. Further, providing a peripheral rim whose section is smaller than that of the crystal in the area where the peripheral rim is connected to the crystal makes ultrasonic welding easier by reducing the quantity of ultrasonic energy required. This is also helps to protect the structures carried on the bottom surface of the crystal.

According to a complementary feature of the invention, the peripheral rim includes a top surface and a bottom surface, the bottom surface of the peripheral rim being closer to the top surface of the crystal than to the bottom surface of said crystal. Consequently, the welding area is as far away as possible from the bottom surface of the crystal on which the elements sensitive to heat and the mechanical stresses induced by heat are structured, which protects these elements as much as possible.

The present invention also concerns an ultrasonic assembly method for a crystal used to close the top of a case of a portable object, said crystal being made of a transparent plastic material and carrying, on a bottom surface opposite a top surface, one or more conductive paths made of a transparent conductive material, said method being characterized in that the crystal includes a peripheral rim which extends along at least one portion of the perimeter of the crystal, said peripheral rim providing a bottom surface for the ultrasonic welding of the crystal onto the case of the portable object, said bottom welding surface being closer to the top surface of the crystal than to the bottom surface of said crystal.

Other features and advantages of the present invention will appear more clearly from the following detailed description of one embodiment of the crystal according to the invention, this example being given solely by way of non-limiting illustration with reference to the annexed drawing, in which.

The present invention proceeds from the general inventive idea which consists in providing a crystal, which is made of transparent plastic material and, for example, closes a watch case, with a peripheral collar whose section is smaller than the section of the crystal in the area where the peripheral collar is connected to the crystal. This collar therefore provides at least one area for the ultrasonic welding of the crystal which, because of its reduced thickness, requires less ultrasonic energy to be provided and thus reduces the risks of damaging the crystal during welding. Moreover, this collar moves the location of the weld away from the bottom surface of the crystal, which also protects the crystal during welding. These features are particularly advantageous in the case where conductive paths made of a transparent conductive material such as ITO and forming, for example, capacitive touch keys for entering data into a control circuit of the watch or an antenna, are structured on the bottom surface of the crystal. Indeed, ITO is hard and therefore brittle and consequently not resistant to increases in temperature and the mechanical stresses caused by localised heating during ultrasonic welding. Further, surfaces covered with ITO cannot be ultrasonic welded. Consequently, moving the welding location away from the conductive paths made of ITO, greatly improves the weld quality in addition to avoiding any risk of damaging the conductive paths made of ITO. The present invention therefore proposes an alternative to the bonding of crystals using an adhesive whose defects are well known: the ageing of the adhesive over time with a risk of sealing defects and poor mechanical resistance.

The present invention will be described with reference to a crystal used for closing the top of a watch case. It goes without saying that the present invention is not limited to this embodiment and that it can be applied to other portable objects, such as a mobile telephone or a computer screen. In such cases, the crystal may be an element intended to protect an underlying display cell or be one of the actual substrates of a display cell.

Figure 1:
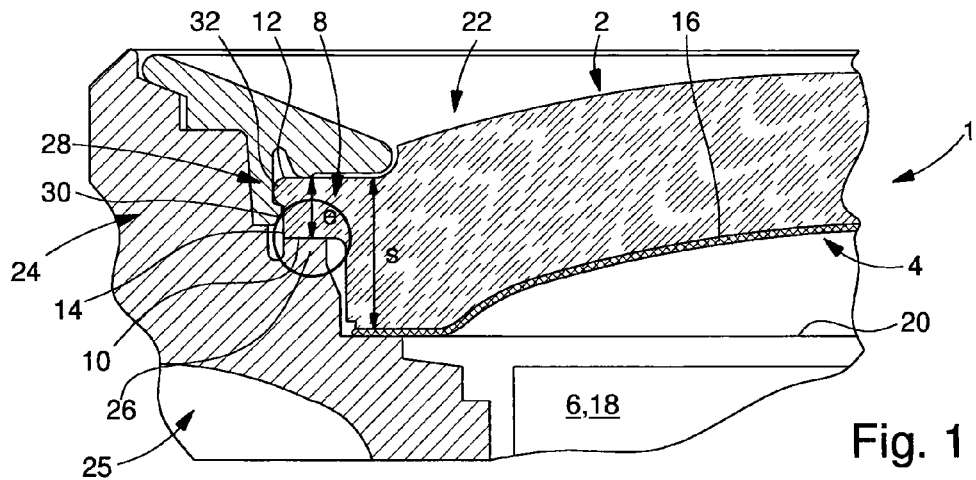
FIG. 1 is a partial cross-section of a watch crystal in the area where the crystal is connected to the middle part and to the bezel of the watch, the crystal being provided with a peripheral rim of substantially square section according to the present invention, the crystal being ultrasonic welded to the middle part of the watch via a first bottom welding surface provided by the peripheral rim.

Reference will now be made to FIG. 1 which is a partial cross-section of a watch crystal according to the invention. Designated as a whole by the general reference numeral 1, the watch crystal includes a top surface 2 facing the side of the user and a bottom surface 4 facing the side of the watch movement 6. It is noted on examining the drawing that the top and bottom surfaces 2 and 4 are curved and extend at a substantially constant distance from each other. Naturally, according to an embodiment that is not shown, the top and bottom surfaces 2 and 4 of crystal 1 could be flat or extend at a variable distance from each other. Crystal 1 is made of a transparent plastic material that can be ultrasonic welded.

According to the invention, crystal 1 has a peripheral rim 8 which extends along at least one portion of the perimeter of crystal 1. In the case of a watch crystal, it is preferable for this peripheral rim to extend over the entire periphery of the crystal. As can be observed in FIG. 1, the peripheral rim 8 has a smaller thickness e than the section s of crystal 1 in the area where peripheral rim 8 is connected to crystal 1.

In the example shown in FIG. 1, the peripheral rim 8 has a substantially square section and thus provides a first bottom welding surface 10 and a second top welding surface 12 which extend parallel to and at a distance from each other and which are connected to each other by a third welding surface 14, which extends substantially perpendicularly to the first and second top and bottom weld surfaces 10 and 12.

It was chosen here to show peripheral rim 8 in the form of a collar of square section. Of course, this example is given purely by way of illustration and the peripheral rim may have a different section, such as a rectangular, triangular, circular or other section.

The bottom welding surface 10 of peripheral rim 8 is closer to top surface 2 of crystal 1 than to bottom surface 4 of said crystal 1. As will be described in more detail below, this arrangement is particularly advantageous when the conductive paths or electrodes 16 made of a transparent conductive material, such as tin indium oxide (ITO), are structured on the bottom surface 4 of crystal 1. These electrodes 16 find application in the manufacture of touch keys for entering data into a control circuit 18 of the watch by varying the capacitance between a user's finger which lightly touches the top surface 2 of crystal 1 and a given electrode 16.

The assembly is completed by a casing ring 20 which houses, in particular, watch control circuit 18. A bezel 22 also abuts the top surface 2 of crystal 1, with the assembly formed by crystal 1 and bezel 22 being mounted on a middle part 24 to form case 25 of the watch.

In the example of FIG. 1, crystal 1 is welded onto middle part 24 of the watch via the first bottom welding surface 10, which abuts on a corresponding shoulder 26 of middle part 24. The welding area is represented by a circle in FIG. 1. This first bottom welding surface 10 extends parallel to and at a distance from electrodes 16 structured on the bottom surface of crystal 1. This arrangement makes it possible to ultrasonic weld crystal 1. Indeed, to date, crystals of this type, whose bottom surface is coated with conductive paths made of ITO or another transparent conductive material, could only be bonded by means of an adhesive since the ITO conductive paths made it almost impossible to ultrasonic weld the crystal. ITO is a hard material which hinders the ultrasonic welding fusion of the layer of plastic material on which the ITO is deposited. Further, because it is hard, ITO is brittle and therefore not resistant to the temperature increases and mechanical stresses induced by ultrasonic welding. Thus, moving the ITO conductive paths away from the area where the ultrasonic welding is performed avoids the risk of damaging the conductive paths. Bezel 22 is simply snap fitted onto crystal 1 via a ring 28 which has a bulge 30 at the base thereof which is locked underneath a corresponding local increase in diameter 32 of crystal 1. In this case, bezel 22 has a purely decorative function and does not participate in the sealing of the watch which is ensured by the weld between crystal 1 and middle part 24.

Figure 2:
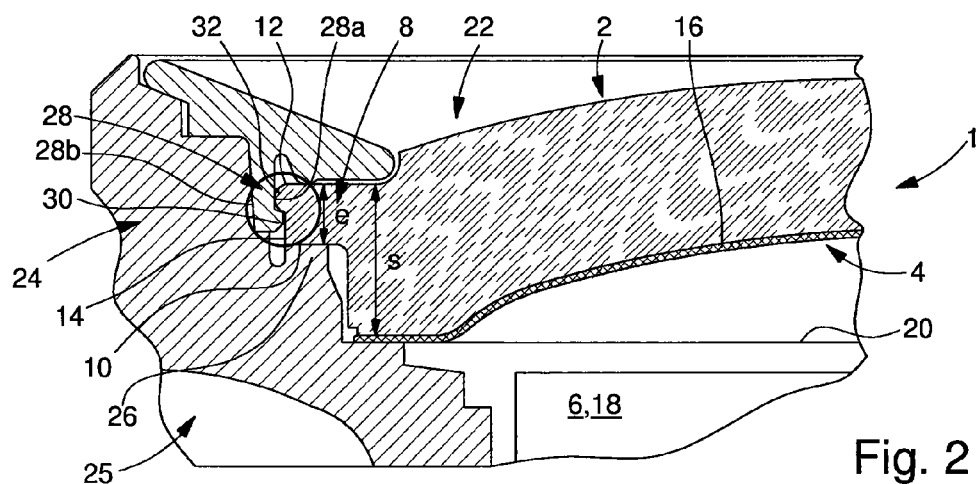
FIG. 2 is a similar view to that of FIG. 1, with the peripheral rim providing a second peripheral welding surface substantially perpendicular to the first welding surface via which the crystal is ultrasonic welded to the bezel, the bezel also being welded to the middle part to ensure the sealing of the watch.

In FIG. 2, crystal 1 is ultrasonic welded onto bezel 22 via the third welding surface 14 which extends substantially perpendicularly to the first and second bottom and top weld surfaces 10 and 12, i.e. perpendicularly to the plane in which casing ring 20 extends. The welding area is represented by a circle in FIG. 2. It is seen that crystal 1 is welded to bezel 22 on the inner surface 28a of ring 28, whereas bezel 22 is welded to middle part 24 on the external surface 28b of ring 28 to ensure the sealing of the watch.

Figure 3:
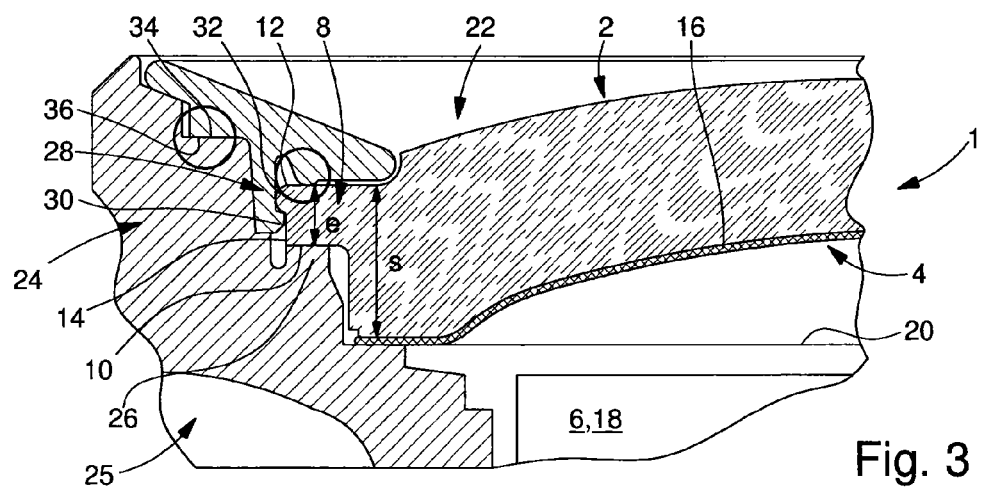
FIG. 3 is a similar view to that of FIG. 1, with the peripheral rim providing a third top welding surface extending substantially parallel to the first bottom welding surface, the crystal being ultrasonic welded onto the bezel via said third surface and the bezel also being ultrasonic welded to the middle part to ensure the sealing of the watch.

In FIG. 3, crystal 1 is welded to bezel 22 via the second top welding surface 12, which extends parallel to and above the first bottom welding surface 10. The weld areas are represented by circles in FIG. 3. To ensure the sealing of the watch, bezel 22 is welded to middle part 24 by an annular rim 34 abutting against a shoulder 36.

Figure 4:
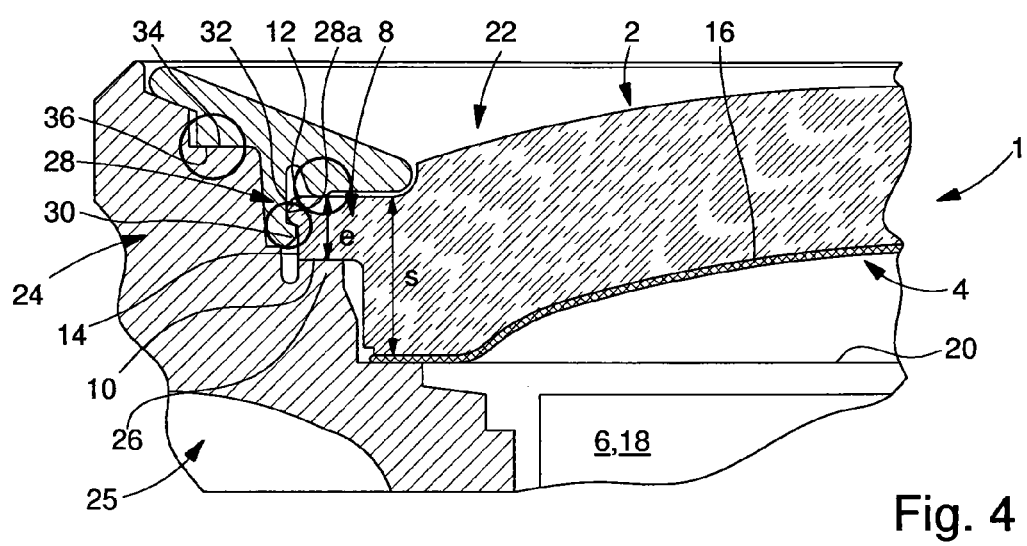
FIG. 4 is a similar view to that of FIG. 3, with the crystal being simultaneously ultrasonic welded onto the bezel via the second and third welding surfaces and the bezel also being welded onto the middle part.

According to a variant of the invention illustrated in FIG. 4, it is possible to weld crystal 1 to bezel 22 simultaneously via the second and third welding surfaces 12 and 14. The weld areas are represented by circles in FIG. 4. Thus, it is seen that crystal 1 is welded to bezel 22, on the one hand, on inner surface 28a of ring 28, and on the other hand, on the second top welding surface 12, which extends parallel to and above the first bottom welding surface 10. For sealing purposes, bezel 22 is welded to middle part 24 on the annular rim 34 thereof.

It is clear that it is also possible to envisage welding crystal 1, on the one hand, to middle part 24 via the first bottom welding surface 10, as illustrated in FIG. 1, and on the other hand, to bezel 22 via the second or third welding surface 12 or 14.

The invention claimed is:

1. A crystal used to close a top of a case of a portable object, wherein the crystal is made of a transparent plastic material and is secured to the case of the portable object by ultrasonic welding, the crystal comprising:
  a top surface and a bottom surface that carries one or more conductive paths made of a transparent conductive material;
  a peripheral rim that extends along at least one portion of the perimeter of the crystal, wherein the peripheral rim provides at least one surface for ultrasonic welding of the crystal to the case of the portable object,
  wherein the peripheral rim includes a top ultrasonic welding surface and a bottom ultrasonic welding surface, the bottom surface of the peripheral rim being closer to the top surface of the crystal than to the bottom surface of the crystal, the top surface and the bottom surface of the peripheral rim being connected to each other by a third ultrasonic welding surface.

2. The crystal according to claim 1, wherein the peripheral rim has a smaller thickness than a section of the crystal in an area where the peripheral rim is connected to the crystal.

3. The crystal according to claim 2, wherein a section of the peripheral rim is rectangular or square.

4. The crystal according to claim 1, wherein a section of the peripheral rim is rectangular or square.

5. A case of a portable object whose top is closed by a crystal made of a transparent plastic material and secured to the case of the portable object by ultrasonic welding, wherein the crystal includes has a top surface and a bottom surface that carries one or more conductive paths made of a transparent conductive material, and a peripheral rim that extends along at least one portion of the perimeter of the crystal, wherein the peripheral rim provides at least one surface for ultrasonic welding of the crystal to the case of the portable object, wherein the peripheral rim includes a top ultrasonic welding surface and a bottom ultrasonic welding surface, the bottom surface of the peripheral rim being closer to the top surface of the crystal than to the bottom surface of the crystal, the top surface and the bottom surface of the peripheral rim being connected to each other by a third ultrasonic welding surface, wherein the case comprises:
  a bezel that abuts on the top surface of the crystal;
  an assembly formed by the crystal and the bezel being mounted on a middle part to form the case of a portable object;
  wherein the crystal is ultrasonic welded, via at least one of the welding surfaces provided by the peripheral rim, to the middle part or the bezel.

6. The crystal according to claim 5, wherein the peripheral rim has a smaller thickness than a section of the crystal in an area where the peripheral rim is connected to the crystal.

7. The crystal according to claim 6, wherein a section of the peripheral rim is rectangular or square.

8. The crystal according to claim 5, wherein a section of the peripheral rim is rectangular or square.

9. A method for ultrasonic assembly of a crystal used to close a top of a case of a portable object, wherein the crystal is made of a transparent plastic material and is secured to the case of the portable object by ultrasonic welding, wherein the crystal includes a top surface and a bottom surface that carries one or more conductive paths made of a transparent conductive material, and a peripheral rim that extends along at least one portion of the perimeter of the crystal, wherein the peripheral rim provides at least one surface for ultrasonic welding of the crystal to the case of the portable object, wherein the peripheral rim includes a top ultrasonic welding surface and a bottom ultrasonic welding surface, the bottom surface of the peripheral rim being closer to the top surface of the crystal than to the bottom surface of the crystal, the top surface and the bottom surface of the peripheral rim being connected to each other by a third ultrasonic welding surface, wherein the method includes:
  taking the crystal and ultrasonic welding the crystal to the case of the portable object via at least one of the welding surfaces provided by the peripheral rim.

10. The assembly method according to claim 9, wherein the peripheral rim has a smaller thickness than a section of the crystal in an area where the peripheral rim is connected to the crystal.

11. The assembly method according to claim 10, wherein a section of the peripheral rim is rectangular or square.

12. The assembly method according to claim 9, wherein a section of the peripheral rim is rectangular or square.

13. A method for ultrasonic assembly of a crystal used to close a top of a case of a portable object, wherein the crystal is made of a transparent plastic material and secured to the case of the portable object by ultrasonic welding, wherein the crystal includes a top surface and a bottom surface that carries one or more conductive paths made of a transparent conductive material, and a peripheral rim that extends along at least one portion of the perimeter of the crystal, wherein the peripheral rim provides at least one surface for ultrasonic welding of the crystal to the case of the portable object, wherein the peripheral rim includes a top ultrasonic welding surface and a bottom ultrasonic welding surface, the bottom surface of the peripheral rim being closer to the top surface of the crystal than to the bottom surface of the crystal, the top surface and the bottom surface of the peripheral rim being connected to each other by a third ultrasonic welding surface, wherein the case of the portable object includes a bezel that abuts on the top surface of the crystal, an assembly formed by the crystal and the bezel being mounted on a middle part to form the case of the portable object, wherein the method includes:
  taking the crystal and ultrasonic welding the crystal to the middle part of the case by the bottom welding surface thereof and to the bezel by at least one of the top welding surface and the third welding surface thereof.

14. The assembly method according to claim 13, wherein the peripheral rim has a smaller thickness than a section of the crystal in an area where the peripheral rim is connected to the crystal.

15. The assembly method according to claim 14, wherein a section of the peripheral rim is rectangular or square.

16. The assembly method according to claim 13, wherein a section of the peripheral rim is rectangular or square.

\* \* \* \* \*